(12) United States Patent
Newton

(10) Patent No.: US 9,057,631 B2
(45) Date of Patent: Jun. 16, 2015

(54) SMOKE DETECTOR WITH AN EASILY-READABLE AND HIGHLY-VISIBLE BATTERY-LIFE DISPLAY

(71) Applicant: Thomas W. Newton, Midlothian, VA (US)

(72) Inventor: Thomas W. Newton, Midlothian, VA (US)

( * ) Notice: Subject to any disclaimer, the term of this patent is extended or adjusted under 35 U.S.C. 154(b) by 58 days.

(21) Appl. No.: 13/950,130

(22) Filed: Jul. 24, 2013

(65) Prior Publication Data

US 2014/0028461 A1 Jan. 30, 2014

Related U.S. Application Data

(60) Provisional application No. 61/675,132, filed on Jul. 24, 2012.

(51) Int. Cl.
| | | |
|---|---|---|
| *G08B 5/24* | (2006.01) | |
| *G01D 13/22* | (2006.01) | |
| *G08B 17/10* | (2006.01) | |
| *G08B 29/18* | (2006.01) | |
| *G01D 7/00* | (2006.01) | |
| *G01R 31/36* | (2006.01) | |

(52) U.S. Cl.
CPC ............... *G01D 13/22* (2013.01); *G01D 7/005* (2013.01); *G08B 17/10* (2013.01); *G01R 31/3682* (2013.01); *G08B 29/181* (2013.01)

(58) Field of Classification Search
CPC ... G01D 13/22; G01D 7/005; G01R 31/3682; G01R 19/16542; G08B 17/10; G08B 29/181; G08B 19/00; G08B 17/00; G08B 21/185; F21V 33/0076; H01M 6/5044
USPC ............... 340/815.78, 636.1, 636.12, 636.15, 340/636.19, 628, 632; 324/133, 433, 435
See application file for complete search history.

(56) References Cited

U.S. PATENT DOCUMENTS

| | | | | | |
|---|---|---|---|---|---|
| 4,020,243 | A | * | 4/1977 | Oldford | ........................ 429/93 |
| 4,287,517 | A | * | 9/1981 | Nagel | ..................... 340/636.15 |
| 4,318,092 | A | * | 3/1982 | Cowles et al. | ........... 340/636.15 |
| 4,419,658 | A | * | 12/1983 | Jarosz et al. | .................. 340/521 |
| 4,471,346 | A | * | 9/1984 | Nelson et al. | ................. 340/628 |

* cited by examiner

*Primary Examiner* — Anh V La

(57) ABSTRACT

A smoke detector with an easily-readable battery-life display is an apparatus that visually displays the remaining battery life for a smoke detector through an analog or digital device. The apparatus primarily includes a smoke detector, a battery power indicator, and a reference resistor. The battery power indicator is positioned on the underside of the smoke detector so that a person can look up at the smoke detector mounted on a ceiling and view the battery power indicator. The reference resistor draws a small amount of current from the battery, which allows the battery power indicator to measure the gradual reduction of voltage readings across the reference resistor and consequently determine the remaining battery life, and thus displaying the remaining battery life in the appropriate zone (red, yellow or green).

11 Claims, 3 Drawing Sheets

SMOKE DETECTOR WITH AN EASILY-READABLE AND HIGHLY-VISIBLE BATTERY-LIFE DISPLAY

The current application claims a priority to the U.S. Provisional Patent application Ser. No. 61/675,132 filed on Jul. 24, 2012.

FIELD OF THE INVENTION

The present invention generally relates to an apparatus for a new feature for a smoke detector. More specifically, the smoke detector more accurately measures and displays the status of the battery.

BACKGROUND OF THE INVENTION

All smoke detectors are powered by utility power with a 9-volt dry cell battery as a backup in time of power failure. Currently, there is no convenient or effective method to visually determine the status of the battery used in a smoke detector. In addition, it is very hard to manually check the power level of the battery because smoke detectors are usually mounted to the ceiling. Therefore, an objective of the present invention is to provide an apparatus which visually displays the amount of "power" remaining in the battery of the smoke detector.

DETAILED DESCRIPTIONS OF THE INVENTION

All illustrations of the drawings are for the purpose of describing selected versions of the present invention and are not intended to limit the scope of the present invention.

Figure 1:
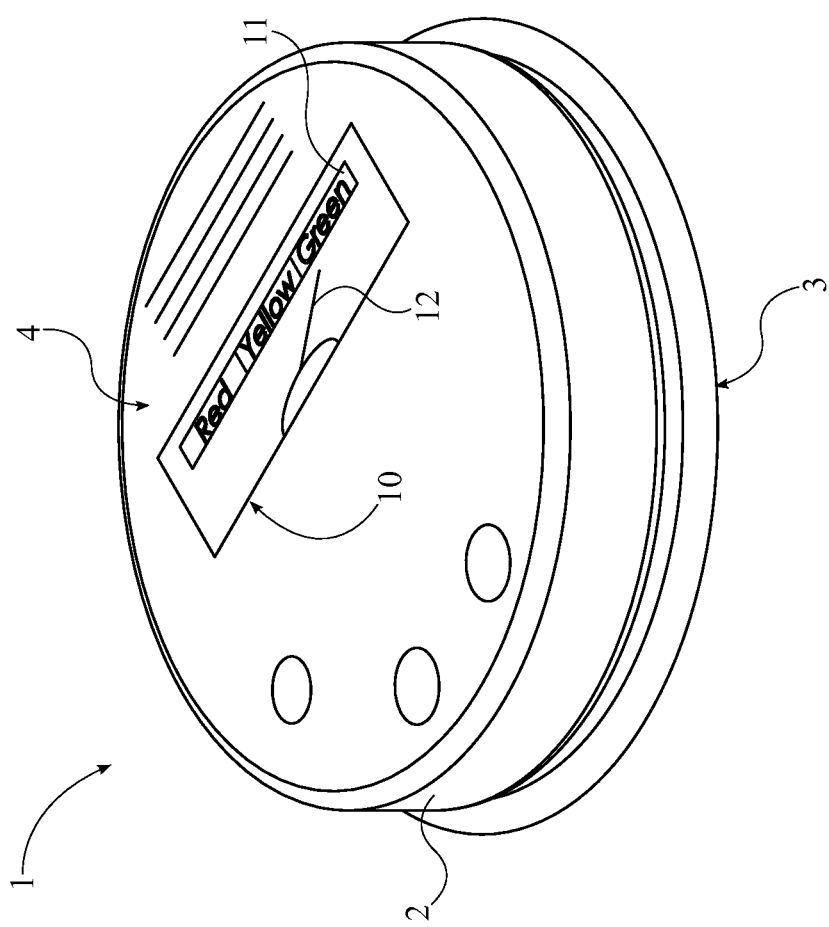
FIG. 1 is a perspective view of the bottom of the present invention.

As can be seen in FIG. 1, the present invention is a smoke detector 1 with an easily-readable and highly-visible battery-life display, which allows a user to see the power level of the smoke detector's battery from afar. In the preferred embodiment of the present invention, a user is able to see the power level of the smoke detector's battery from 25 to 30 feet away. The present invention mainly comprises a smoke detector 1, a battery power indicator 8, and a reference resistor 13. The smoke detector 1 is a household device that detects the presence of smoke in order to alarm the home dwellers of a possible fire. The smoke detector 1 comprises an enclosure 2 and a battery 5. The enclosure 2 provides an outer structural housing for the internal components of the smoke detector 1, and the battery 5 provides the electric power that is needed to operate the smoke detector 1. The battery power indicator 8 is optimally positioned on the enclosure 2 so that the battery power indicator 8 can be easily seen by a person standing on the floor. The reference resistor 13 draws a minuscule amount of current from the battery 5, which allows the present invention to monitor the gradual reduction of in the voltage readings across the reference resistor 13.

Figure 2:
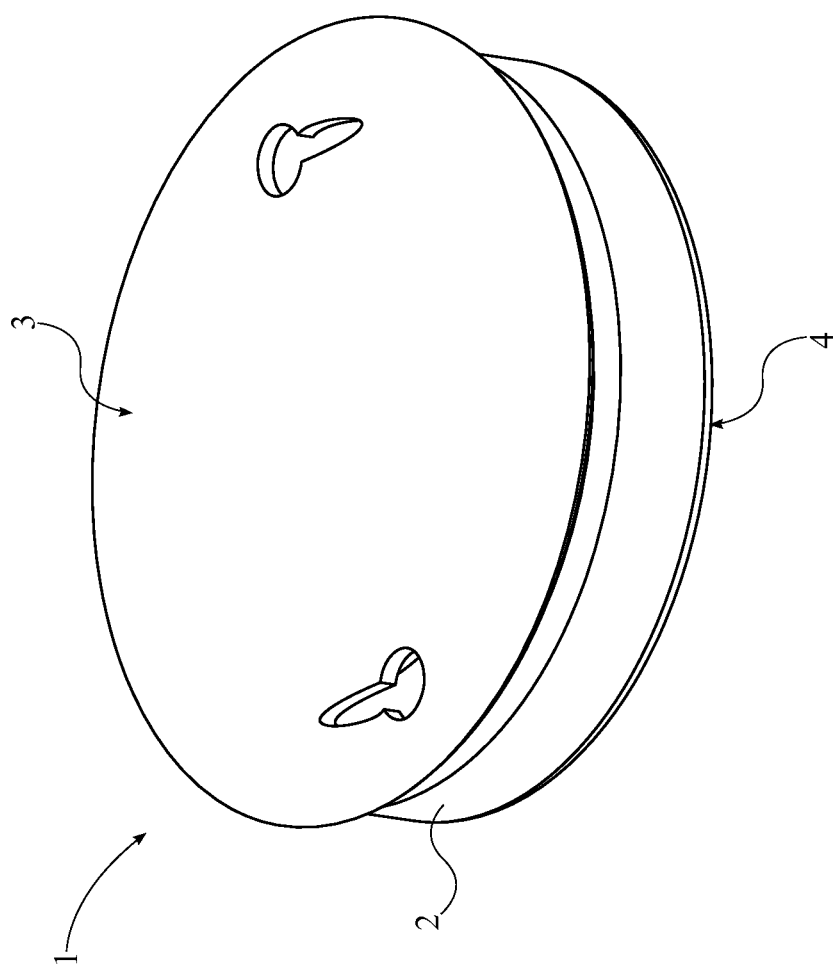
FIG. 2 is a perspective view of the top of the present invention.

The battery power indicator 8 continuously measures the voltage across the reference resistor 13 and visually notifies a user of the present power level of the battery 5. Consequently, the battery power indicator 8 comprises an ammeter 9 and a display panel 10. Furthermore, the enclosure 2 comprises a topside 3 and an underside 4, which are positioned opposite to each other through the enclosure 2. The topside 3 is usually attached to the ceiling, and the underside 4 is facing downwards toward the floor, which are illustrated in FIGS. 1 and 2. Thus, the display panel 10 is positioned on the underside 4 of the enclosure 2 so that a person standing on the floor could look up at the smoke detector 1 and read the display panel 10. The display panel 10 comprises two prominent visual markers: a status bar 11 and a visual pointer 12. The status bar 11 allows a person to easily distinguish between the different health levels of the battery 5. In the preferred embodiment of the present invention, the status bar 11 is shown with three different health levels: green for a healthy battery (100% to 50%), yellow for an ailing battery (50% to 25%), and red for a failing battery (25% to 0%). The smoke detector 1 is able to sound a good decibel alarm for green, a weak decibel alarm for yellow, and an inaudible decibel alarm for red. The visual pointer 12 is used to indicate what the health of the battery 5 is on the status bar 11.

The display panel 10 can either be an analog device or a digital device. In the case of an analog device, the status bar 11 would be printed onto the display panel 10, and the visual pointer 12 would be pivotally connected to the display panel 10 in such a way that the visual pointer 12 could rotate among the different health statuses shown on the status bar 11. In the case of a digital device, the status bar 11 and the visual pointer 12 would be electronically depicted by the display panel 10, but the status bar 11 and the visual pointer 12 would function in the same way as the analog device.

Figure 3:
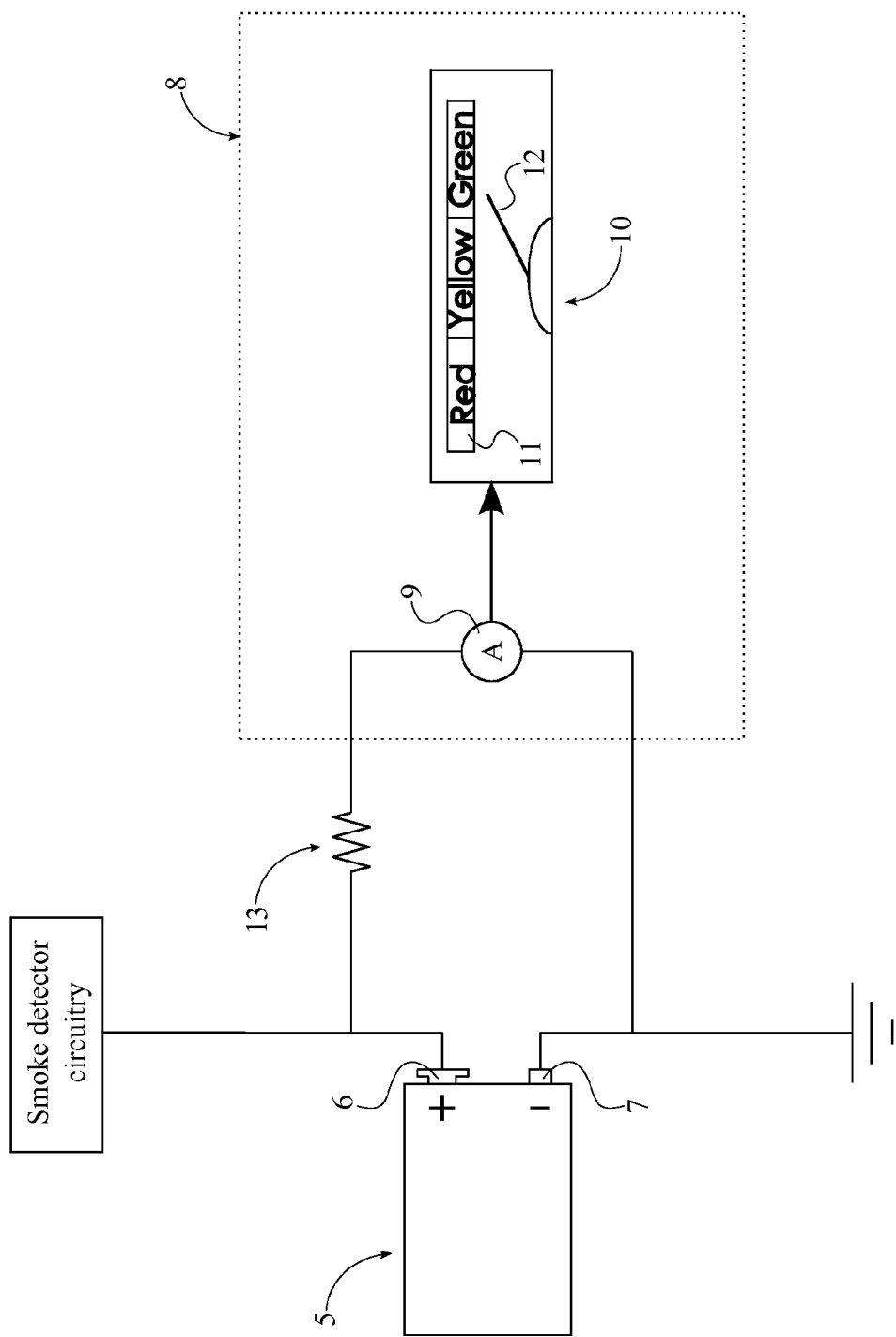
FIG. 3 is a schematic for the electronic components of the present invention.

In reference to FIG. 3, the electrical components of the present invention are configured to accurately measure the remaining life of the battery 5. The battery 5, the ammeter 9, and the reference resistor 13 are located within the enclosure 2 so that the electrical connections between these components stay intact. The ammeter 9 and the reference resistor 13 is electrically connected in parallel to the battery 5, which prevents the reference resistor 13 from draining the battery 5 from the smoke detector's typical circuitry. The reference resistor 13 should have a large resistance value so that almost all of the current from the battery 5 will flow into the smoke detector's typical circuitry. The ammeter 9 is an instrument that is used to measure the electric current in a circuit path. Thus, the ammeter 9 is electrically connected in series to the reference resistor 13 so that the ammeter 9 can measure the electric current travelling through the reference resistor 13. The current measurement made by the ammeter 9 can be converted into a voltage calculation for the reference resistor 13 because the current and voltage are proportional to each other. A change in the voltage calculation means that the battery 5 is not capable of producing its original power output. For example, the voltage calculation for the reference resistor 13 should be 9 volts for a 9-volt battery, but over time, if the voltage calculation for the reference resistor 13 decreases to 4 volts, then the 9-volt battery 5 is failing. The display panel 10 is electronically connected to the ammeter 9 through a circuit board so that the display panel 10 can depict the voltage calculation for the reference resistor 13 as a health status on the status bar 11. In the preferred embodiment of the present invention, the battery 5 is a 9-volt battery 5 and comprises a positive post 6 and a negative post 7, which are the electrical connectors of the battery 5. More specifically, the reference resistor 13 is electrically connected to the positive post 6, and the ammeter 9 is electrically connected to the negative post 7.

Although the invention has been explained in relation to its preferred embodiment, it is to be understood that many other possible modifications and variations can be made without departing from the spirit and scope of the invention as hereinafter claimed.

What is claimed is:

1. A smoke detector with an easily-readable battery-life display comprises:
    a smoke detector;
    a battery power indicator;
    a reference resistor;
    said smoke detector comprises an enclosure and a battery;
    said battery power indicator comprises an ammeter and a display panel;
    said display panel comprises a status bar and a visual pointer;
    said enclosure comprises a topside and an underside;
    said underside being positioned opposite to said topside through said enclosure;
    said display panel being positioned on said underside;
    said battery, said ammeter, and said reference resistor being located within said enclosure;
    said ammeter and said reference resistor being electrically connected in parallel to said battery;
    said ammeter being electrically connected in series to said reference resistor;
    said display panel being electronically connected to said ammeter;
    said battery comprises a positive post and a negative post;
    said reference resistor being electrically connected to said positive post; and
    said ammeter being electrically connected to said negative post.

2. The smoke detector with an easily-readable battery-life display as claimed in claim 1 comprises:
    said display panel being an analog device;
    said status bar being printed on said display panel;
    said visual pointer being pivotally connected to said display panel; and
    said visual pointer being positioned to move along said status bar.

3. The smoke detector with an easily-readable battery-life display as claimed in claim 1 comprises:
    said display panel being a digital device;
    said status bar and visual pointer being electronically depicted by said display panel; and
    said visual pointer being positioned to move along said status bar.

4. A smoke detector with an easily-readable battery-life display comprises:
    a smoke detector;
    a battery power indicator;
    a reference resistor;
    said smoke detector comprises an enclosure and a battery;
    said battery power indicator comprises an ammeter and a display panel;
    said display panel comprises a status bar and a visual pointer;
    said enclosure comprises a topside and an underside;
    said underside being positioned opposite to said topside through said enclosure;
    said display panel being positioned on said underside;
    said battery, said ammeter, and said reference resistor being located within said enclosure; and
    said ammeter and said reference resistor being electrically connected in parallel to said battery.

5. The smoke detector with an easily-readable battery-life display as claimed in claim 4 comprises:
    said display panel being an analog device;
    said status bar being printed on said display panel;
    said visual pointer being pivotally connected to said display panel; and
    said visual pointer being positioned to move along said status bar.

6. The smoke detector with an easily-readable battery-life display as claimed in claim 4 comprises:
    said display panel being a digital device;
    said status bar and visual pointer being electronically depicted by said display panel; and
    said visual pointer being positioned to move along said status bar.

7. The smoke detector with an easily-readable battery-life display as claimed in claim 4 comprises:
    said ammeter being electrically connected in series to said reference resistor;
    said display panel being electronically connected to said ammeter;
    said battery comprises a positive post and a negative post;
    said reference resistor being electrically connected to said positive post; and
    said ammeter being electrically connected to said negative post.

8. A smoke detector with an easily-readable battery-life display comprises:
    a smoke detector;
    a battery power indicator;
    a reference resistor;
    said smoke detector comprises an enclosure and a battery;
    said battery power indicator comprises an ammeter and a display panel;
    said display panel comprises a status bar and a visual pointer;
    said enclosure comprises a topside and an underside;
    said underside being positioned opposite to said topside through said enclosure;
    said display panel being positioned on said underside;
    said battery, said ammeter, and said reference resistor being located within said enclosure;
    said ammeter and said reference resistor being electrically connected in parallel to said battery;
    said ammeter being electrically connected in series to said reference resistor; and
    said display panel being electronically connected to said ammeter.

9. The smoke detector with an easily-readable battery-life display as claimed in claim 8 comprises:
    said display panel being an analog device;
    said status bar being printed on said display panel;
    said visual pointer being pivotally connected to said display panel; and
    said visual pointer being positioned to move along said status bar.

10. The smoke detector with an easily-readable battery-life display as claimed in claim 8 comprises:
    said display panel being a digital device;
    said status bar and visual pointer being electronically depicted by said display panel; and
    said visual pointer being positioned to move along said status bar.

11. The smoke detector with an easily-readable battery-life display as claimed in claim 8 comprises:
    said battery comprises a positive post and a negative post;
    said reference resistor being electrically connected to said positive post; and said ammeter being electrically connected to said negative post.

* * * * *